US009367528B2

(12) United States Patent
Bellessort et al.

(10) Patent No.: US 9,367,528 B2
(45) Date of Patent: Jun. 14, 2016

(54) METHOD AND DEVICE FOR DOCUMENT CODING AND METHOD AND DEVICE FOR DOCUMENT DECODING

(75) Inventors: Romain Bellessort, Rennes (FR); Hervé Ruellan, Rennes (FR)

(73) Assignee: Canon Kabushiki Kaisha, Tokyo (JP)

( * ) Notice: Subject to any disclaimer, the term of this patent is extended or adjusted under 35 U.S.C. 154(b) by 872 days.

(21) Appl. No.: 12/529,665

(22) PCT Filed: Feb. 29, 2008

(86) PCT No.: PCT/IB2008/002151
§ 371 (c)(1),
(2), (4) Date: Sep. 16, 2009

(87) PCT Pub. No.: WO2008/142574
PCT Pub. Date: Nov. 27, 2008

(65) Prior Publication Data
US 2010/0115397 A1 May 6, 2010

(30) Foreign Application Priority Data

Mar. 2, 2007 (FR) ...................................... 07 53630

(51) Int. Cl.
*G06F 17/22* (2006.01)
*G06F 17/30* (2006.01)
*H03M 7/30* (2006.01)

(52) U.S. Cl.
CPC ........ *G06F 17/2247* (2013.01); *G06F 17/2205* (2013.01); *G06F 17/2258* (2013.01); *G06F 17/3092* (2013.01); *H03M 7/30* (2013.01)

(58) Field of Classification Search
CPC ...................................................... G06F 17/20

USPC .......................................................... 715/234
See application file for complete search history.

(56) References Cited

U.S. PATENT DOCUMENTS

| 7,387,261 B2 * | 6/2008 | Onishi ........................... 235/494 |
| 2004/0210573 A1 * | 10/2004 | Abe et al. ........................... 707/5 |
| 2004/0230577 A1 * | 11/2004 | Kawatani ........................... 707/6 |
| 2005/0022115 A1 * | 1/2005 | Baumgartner et al. ........ 715/513 |

(Continued)

OTHER PUBLICATIONS

Adiego, J., et al., "Lempel-Ziv Compression of Highly Structured Documents", Journal of the American Society for Information Science and Technology, vol. 58, No. 4, Jan. 25, 2007, pp. 461-478.

(Continued)

*Primary Examiner* — Laurie Ries
*Assistant Examiner* — Tionna Burke
(74) *Attorney, Agent, or Firm* — Fitzpatrick, Cella, Harper & Scinto (57) ABSTRACT

The method of coding a structured document comprises: —a step of obtaining at least one pattern designated as "primary" representing at least one of the pieces of structural information of data of said document, —a step (200 to 230) of obtaining a part of the document different from the entirety of the document, —a step of creating at least one derived pattern formed by modifying a primary pattern, representing data of said part of the document and—a step of coding data of the document to provide a code, said code associating a pattern with at least one piece of coded data. In embodiments, during the coding step, a step is carried out of determining a pattern that best describes data to code, the pattern associated with said data being that closest pattern.

20 Claims, 6 Drawing Sheets

(56) References Cited

U.S. PATENT DOCUMENTS

| | | | |
|---|---|---|---|
| 2008/0098029 A1 | 4/2008 | Ruellan | 707/102 |
| 2008/0250055 A1 | 10/2008 | Ruellan et al. | 707/102 |
| 2009/0138529 A1 | 5/2009 | Bellessort | 707/203 |
| 2009/0254882 A1 | 10/2009 | Ruellan | 717/120 |
| 2009/0287625 A1 | 11/2009 | Fablet et al. | 706/45 |

OTHER PUBLICATIONS

Liu, Z., et al., "HTTP Compression Techniques", Wireless Communications and Networking Conference, 2005 IEEE, New Orleans, LA, Mar. 13-17, 2005, pp. 2495-2500.

Ng., W., et al., "Comparative Analysis of XML Compression Technologies", World Wide Web; Internet and Web Information Systems, vol. 9, No. 1, Mar. 1, 2006, pp. 5-33.

Ma, J., et al., "Fragment-based Delta Encoding: A New Scheme for Efficient Delivery of Dynamic Web Pages", Computer and Information Technology, 2006, CIT '06 the Sixth International Conference on IEEE, Sep. 2006, pp. 101-101.

Douglis, F., et al., "Application-specific Delta-encoding via Resemblance Detection", Processings of the USENIX Annual Technical Conference, Jun. 9, 2003, pp. 113-126.

\* cited by examiner

METHOD AND DEVICE FOR DOCUMENT CODING AND METHOD AND DEVICE FOR DOCUMENT DECODING

The present invention concerns a method and device for coding a document and a method and device for decoding a document. It applies, in particular, to the XML language (XML being the acronym for "Extensible Markup Language"). This language is a syntax for defining computer languages. Thus XML makes it possible to create languages that are adapted for different uses but which may be processed by the same tools.

An XML document is composed of elements, each element starting with an opening tag comprising the name of the element (for example: <tag>) and ending with a closing tag which also comprises the name of the element (for example </tag>). Each element may contain other elements, termed "child elements" (a filiation terminology, "parent", "child", being used to describe the relationships between the nested elements) or text data.

Furthermore, an element may be specified by attributes, each attribute being defined by a name and having a value. The attributes are placed in the opening tag of the element they specify (for example <tag attribute"value">).

XML syntax also makes it possible to define comments (for example <!--Comment-->) and processing instructions, which may specify to a computer application the processing operations to apply to the XML document (for example "<?myprocessing?>").

The set of the elements, attributes, text data, comments and processing instructions are grouped together under the generic name of "node".

An XML document may be described in terms of events, for example in the case of XML parsers working in streaming mode, that is to say representing an XML document as a data stream, such as the SAX parsers (SAX being the acronym for "Simple API for XML"). Thus, for example, an XML element will be represented by a start element event, a set of events representing its attributes, another set of events representing its content and an end element event.

Several different XML languages may contain elements of the same name. To be able to mix several different XML languages, an addition has been made to XML syntax making it possible to define "Namespaces". Two elements are identical only if they have the same name and are situated in the same namespace. A namespace is defined by a URI (acronym for "Uniform Resource Identifier"), for example "http://canon.crf.fr/xml/mylanguage". The use of a namespace in an XML document is via the definition of a prefix which is a shortcut to the URI of that namespace. This prefix is defined using a specific attribute (for example "xmlns:ml="http://canon.crf.fr/xml/mylanguage" associates the prefix "ml" with the URI "http://canon.crf.fr/xml/mylanguage"). Next, the namespace of an element or of an attribute will be specified by having its name preceded by the prefix associated with the namespace followed by ':' (for example '<ml:balise ml:attribut="valeur">').

The "XML Schema" standard defines a language making it possible to describe the structure of a set of XML documents. An XML Schema document is an XML document, and describes all the elements and attributes that may be present in an XML document in accordance with that XML Schema document, as well as the relationships between those elements and those attributes.

Other systems enable the structure of a set of XML documents to be described, such as DTDs (acronym for "Document Type Definition") or such as the Relax NG language.

XML has numerous advantages and has become a standard for storing data in a file or for exchanging data. XML makes it possible in particular to have numerous tools for processing the files generated. Furthermore, an XML document may be manually edited with a simple text editor. Moreover, as an XML document contains its structure integrated with the data, such a document is very readable even without knowing the specification.

The main drawback of the XML syntax is to be very prolix. Thus the size of an XML document may be several times greater than the inherent size of the data. This large size of XML documents thus leads to a long processing time when XML documents are generated and especially when they are read.

To mitigate these drawbacks, other methods for coding an XML document have been sought. The object of these methods is to code the content of the XML document in a more efficient form, but enabling the XML document to be easily reconstructed. However, most of these methods do not maintain all the advantages of the XML format.

Among these methods, the simplest consists of coding the structural data in a binary format instead of using a text format. Furthermore, the redundancy of the structural information in the XML format may be eliminated or at least reduced (for example, it is not necessarily useful to specify the name of the element in the opening tag and the closing tag).

Another method is to use an index table, in particular for the names of elements and attributes which are generally repeated in an XML document. Thus, at the first occurrence of an element name, it is coded normally in the file and an index is associated with it. Next, for the following occurrences of this element name, the index will be used instead of the complete string, reducing the size of the document generated, but also facilitating the reading (there is no longer need to read the complete string in the file, and furthermore, the determination of the read element may be carried out by a comparison of integers instead of a comparison of strings of characters).

A second set of methods relies on the use of patterns detected in the XML document to code. These patterns represent pieces of structural information and certain pieces of content information of the XML document. The object of these methods is to code the repeated patterns in the XML document to avoid coding the same information several times.

These coding methods are very efficient for XML documents containing numerous repetitions of structures that are identical or very similar.

In certain cases, it is worthwhile to be able to start coding a document without knowing it fully ("streaming"). However, as regards binary XML and patterns, the methods described earlier are intended to be applied to documents which are entirely known.

Yet none of the methods for detecting patterns cited above is adapted to streaming.

The present invention is directed to mitigating these drawbacks and, in particular, to providing a method for producing structural patterns making it possible to efficiently code XML data when streaming.

To that end, according to a first aspect, the present invention is directed to a method of coding a structured document, characterized in that it comprises:

a step of obtaining at least one pattern designated as "primary" representing at least one of the pieces of structural information of data of said document, a step of obtaining a part of the document different from the entirety of the document, a step of creating at least one derived pattern formed by modifying a primary pattern, representing data of said part of the document and a step of coding data of the document to provide a code, said code associating a pattern with at least one piece of coded data.

Thus, the method of the present invention makes it possible to start with primary patterns, then to enrich those primary patterns when more information from the document is available.

By virtue of this mechanism, if certain pieces of redundant information are unknown, that lack of knowledge is only temporary, and an efficient means is available for adding those pieces of unknown information to the patterns already defined in particular by coding the difference with a pattern of the same family sharing a common structure.

According to particular features, during the coding step, a step is carried out of determining a pattern that best describes data to code, the pattern associated with said data being that closest pattern.

According to particular features, during said step of determining a pattern that best describes data to code, the pattern that best describes data to code is the pattern for which the coding of the differences between the data to code and said pattern uses the least quantity of information.

By virtue of each of these provisions, the coding is optimized in terms of the resulting quantity of information.

According to particular features, the method as succinctly set forth above further comprises a step of coding a definition of a pattern associated with coded data.

According to particular features, during the step of coding a definition of a pattern, the definition of the pattern is coded by coding the difference between the data represented by that pattern and the data represented by another pattern already coded.

By virtue of this type of coding, the definition of the pattern is also coded efficiently.

According to particular features, the method as succinctly set forth above comprises a step of triggering the step of creating at least one derived pattern, during which comparison is made with at least one predetermined threshold value, for data of said part of the document, of a number of instances of patterns of a pattern family comprising a primary pattern and each pattern derived from said primary pattern and, in case of equality, the step of creating at least one derived pattern is triggered.

According to particular features, during the triggering step, said number of instances is compared to a limit threshold value and if the number of instances is greater than said limit threshold value, the derived pattern creating step is not triggered.

Thus, the cost of each pattern is limited, both in terms of memory space occupied and in terms of operations to carry out: more particularly, definition is made of the maximum number of instances considered for constructing and enriching a pattern and so long as that number is not reached the instances are stored, but, one that number has been reached, it is known that no further processing operation is to be carried out on the pattern, and the instances that had been kept can thus be erased.

According to particular features, during the step of creating at least one derived pattern, a step is carried out of extracting redundancy of different instances of a pattern and the derived pattern represents said redundancy.

It is to be noted that the derived pattern represents the redundancy but also other information: that which appears in the primary pattern, and also, where applicable, redundancy information extracted earlier.

According to particular features, during the step of extracting redundancy, said redundancy comprises each constant sub-pattern of said instances.

According to particular features, during the step of extracting redundancy, said redundancy comprises each constant content of said instances.

By virtue of each of these provisions, the compression rate is high since constant parts of the instances are represented by the same derived pattern.

According to particular features, during the redundancy extracting step, said redundancy comprises each sub-pattern having a degree of presence in the instances greater than a predetermined limit value.

According to particular features, during the redundancy extracting step, said redundancy comprises each content having a degree of presence in the instances greater than a predetermined limit value.

By virtue of each of these provisions, compared with the use of the sub-patterns or constant contents, the same derived pattern represents a greater number of different while maintaining a good compression rate.

Thus, the data contained in a pattern are hierarchized by degree of probability of redundancy: when few instances of a pattern are available, the most probable redundancy is searched for. On the other hand, when more instances are available, attention is turned to information which has less chance of being redundant.

According to particular features, during the coding step, the code supplied represents the difference between the data represented by a pattern and the pattern with which said data are associated.

According to particular features, said document is a document in XML language.

According to particular features, the method as succinctly set forth above comprises a step of creating a composite event which collects together an element of the document and at least one of its child nodes associated with the same pattern as said element.

It is to be noted that this composite event replaces the separate events and combines, on the one hand, a reference to a pattern (which makes it possible to know the structure of the data) and, on the other hand, the information which appears in the instance but not in that pattern (for example text content information). Thus, all the information is kept in the form of a single event, instead of being in separate events. Memory space is thus liberated and, consequently, it is possible to acquire more data at the same time, which makes it possible to obtain better results in terms of compression.

Thus, the method of the present invention is efficient for the creation of patterns, both in terms of coding speed and in terms of data amount.

According to a second aspect, the present invention concerns a method of decoding a structured document, characterized in that it comprises:

a step of obtaining at least one pattern designated as "primary" representing at least one of the pieces of structural information of data of said document, a step of obtaining data of said document to decode that are associated with said at least one primary pattern, a step of creating at least one derived pattern formed by modifying a primary pattern, representing said data and a step of decoding data to decode on the basis of said derived pattern.

According to a third aspect, the present invention concerns a device for coding a structured document, characterized in that it comprises:

a means for obtaining at least one pattern designated as "primary" representing at least one of the pieces of structural information of data of said document, a means for obtaining a part of the document different from the entirety of the document, a means for creating at least one derived pattern formed by modifying a primary pattern, representing data of said part of the document and a means for coding data of the document to provide a code, said code associating a pattern with at least one piece of coded data.

According to a fourth aspect, the present invention concerns a device for decoding a structured document, characterized in that it comprises:

a means for obtaining at least one pattern designated as "primary" representing at least one of the pieces of structural information of data of said document, a means for obtaining data of said document to decode that are associated with said at least one primary pattern, a means for creating at least one derived pattern formed by modifying a primary pattern, representing said data and a means for decoding data to decode on the basis of said derived pattern.

According to a fifth aspect, the present invention concerns a computer program loadable into a computer system, said program containing instructions enabling the implementation of the coding method as succinctly set forth above and/or of the decoding method as succinctly set forth above.

According to a sixth aspect, the present invention concerns an information carrier readable by a computer or a microprocessor, removable or not, storing instructions of a computer program, characterized in that it enables the implementation of the coding method as succinctly set forth above and/or of the decoding method as succinctly set forth above.

As the advantages, objectives and features of this coding method, of these devices, of this program and of this information carrier are similar to those of the method of the present invention, as succinctly set forth above, they are not reviewed here.

Other advantages, objectives and features of the present invention will emerge from the following description given, with an explanatory purpose that is in no way limiting, with respect to the accompanying drawings, in which.

Figure 1:
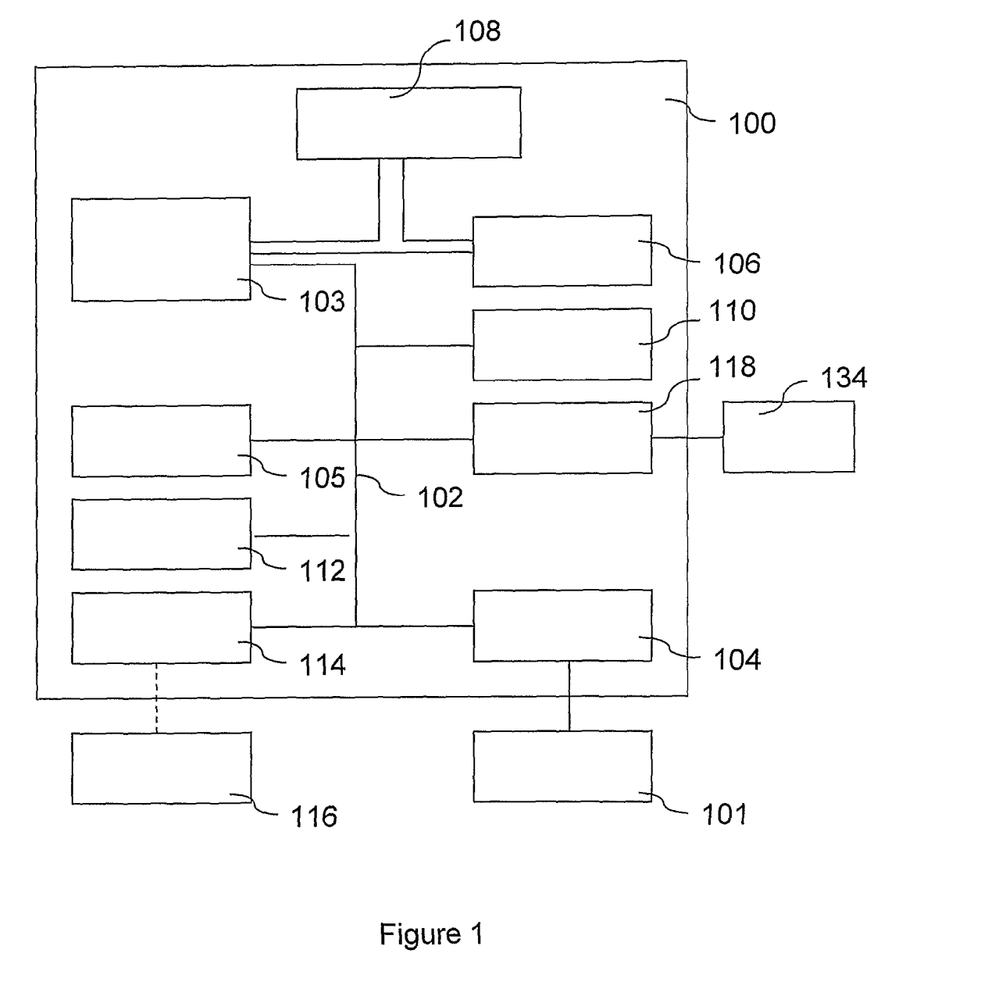
FIG. 1 is a diagrammatic representation of a particular embodiment of the coding device and of the decoding device of the present invention.

FIG. 1 shows a particular embodiment of the coding device and of the decoding device of the present invention, 100 and different peripherals adapted to implement each aspect of the present invention. In the embodiment illustrated in FIG. 1, the device 100 is a micro-computer of known type connected, in the case of the coder, via a graphics card 104, to a means for acquisition or storage of structured documents 101, for example an interface with a local computer network or with a memory, adapted to provide data of a structured document.

The device 100 comprises a communication interface 118 connected to a network 134 able to transmit, as input, digital data to code or decode and, as output, data coded or decoded by the device 100. The device 100 also comprises a storage means 112, for example a hard disk, and a drive 114 for a diskette 116. The diskette 116 and the storage means 112 may contain data to code or to decode, coded or decoded data and a computer program adapted to implement the method of coding or the method of decoding of the present invention.

According to a variant, the program enabling the device to implement the present invention is stored in ROM (read only memory) 106. In another variant, the program is received via the communication network 134 before being stored.

The device 100 has a screen 105 for viewing the data to be to coded or decoded or for serving as an interface with the user for parameterizing certain operating modes of the device 100, using a keyboard 110 and/or a mouse for example.

A CPU (central processing unit) 103 executes the instructions of the computer program and of programs necessary for its operation, for example an operating system. On powering up of the device 100, the programs stored in a non-volatile memory, for example the read only memory 106, the hard disk 112 or the diskette 116, are transferred into a random access memory RAM 108, which will then contain the executable code of the program of the present invention as well as registers for storing the variables necessary for its implementation.

Naturally, the diskette 116 may be replaced by any type of removable information carrier, such as a compact disc, memory card or key. In more general terms, an information storage means, which can be read by a computer or microprocessor, integrated or not into the device, and which may possibly be removable, stores a program of the present invention. A communication bus 102 affords communication between the different elements included in the device 100 or connected to it. The representation, in FIG. 1, of the bus 102 is non-limiting and in particular the central processing unit 103 unit may communicate instructions to any element of the device 100 directly or by means of another element of the device 100.

The device described here and, particularly, the central processing unit 103, may implement all or part of the processing operations described with reference to FIGS. 2 to 6, to implement each method of the present invention and constitute each device of the present invention.

In the whole of the rest of the description, it is stated that a pattern is "the closest", "the most representative" or "best describes" an element, if it minimizes the quantity of information representing the difference between that element and that pattern.

In the whole of the description, the value of the thresholds mentioned is determined, for example, by learning (the threshold values are chosen which, on average, make it possible to obtain the best result in terms of compression) and/or on the basis of the available resources (processing capacity of a central processing unit or quantity of buffer memory available, for example).

Below, an XML document example is firstly presented to which the invention may be applied.

```
100      <contacts>
110           <!-- 1st instance -->
```

```
111         <person>
112              <firstName>John</firstName>
113              <lastName>Smith </lastName>
114         </person>
120            <!-- 2nd instance -->
121         <person>
122              <firstName>Mary</firstName>
123              <lastName>Smith</lastName>
124         </person>
130            <!-- 3rd instance -->
131         <person>
132              <firstName>Jack</firstName>
133              <lastName>Smith </lastName>
134         </person>
140            <!-- 4th instance -->
141         <person>
142              <firstName>Emma</firstName>
143              <lastName>Smith </lastName>
144         </person>
150            <!-- 5th instance -->
151         <person>
152              <firstName>Tony</firstName>
153              <lastName>Smith </lastName>
154         </person>
160            <!-- 6th instance -->
161         <person>
162              <firstName>Kate</firstName>
163              <lastName>Smith </lastName>
164         </person>
199      </contacts>
```

The document describes a list of persons by stating, for each, his or her first name and his or her last name. With regard to the document, a presentation is given below of a family of patterns associated with the "person" element in a particular embodiment of the coding method of the present invention. This family comprises three patterns:
- a primary pattern MP, describing solely the structure of the XML element (name, attributes, type of child nodes),
- a derived pattern including the sub-patterns (MS), which derived pattern repeats the primary pattern to which are added the redundant sub-patterns (the sub-patterns of "person" are always "firstName" and "lastName" in this document) and
- a derived pattern including the content (MC), which pattern repeats the sub-patterns MS to which are added the redundant text values (the value of the content of the "lastName" element is always "Smith").

Family F of the patterns associated with the "person" element

| Primary pattern (MP) | Sub-patterns pattern (MS) | Content pattern (MC) |
|---|---|---|
| <person><br>  Pattern<br>  Pattern<br></person> | <person><br>  <firstName><br>    Content<br>  </firstName><br>  <lastName><br>    Content<br>  </lastName><br></person> | <person><br>  <firstName><br>    Content<br>  </firstName><br>  <lastName><br>    Smith<br>  </lastName><br></person> |

The derived patterns are produced successively by implementation of the present invention in its embodiment described in the drawings. The case of the XML document presented above is used to illustrate the operation of the coding method of the present invention.

Although the structure used in the case of the presented document to describe each person is identical (person, last name and first name), this is not a necessary condition for the implementation of the present invention.

Thus, let it be supposed that the second instance is the following:

```
<person>
    <firstName>Mary</firstName>
    <lastName>Smith</lastName>
    <city>London</city>
</person>
```

In this case, when this instance is processed, it is compared to the first in order to determine the quantity of differences that exist between them. This operation makes it possible to measure the distance between those instances, and if this is less than a predetermined threshold, it is considered that they belong to the same family F. Several options may then be envisaged: either modify the definition of the primary pattern MP by adding a new sub-pattern (in this case, it will be necessary to code the absence of the third sub-pattern for each instance of (firstName, lastName) type) or else keep the same definition of the primary pattern MP (in this case, it will be necessary to code the existence of a third pattern for each instance of (firstName, lastName, city) type. It should be noted that the definition of the primary pattern must no longer be modified as from the time at which an instance is coded with that pattern or one of its derivatives, and to determine the most representative primary pattern (in our case, the presence or absence of a third sub-pattern), the instances must therefore be considered that are acquired up to the time at which the number of instances for the family considered attains what will be named in what follows as "primary threshold" (threshold starting from which the patterns are used to code the instances). If the value "3" is taken for this primary threshold in this example in which the second instance has been modified, it is found that there are two instances of (firstName, lastName) type and one instance of (firstName, lastName, city) type: it is thus chosen not to include the third sub-pattern in the primary pattern, since this type of instance is, according to the acquired data, less representative.

Figure 2:
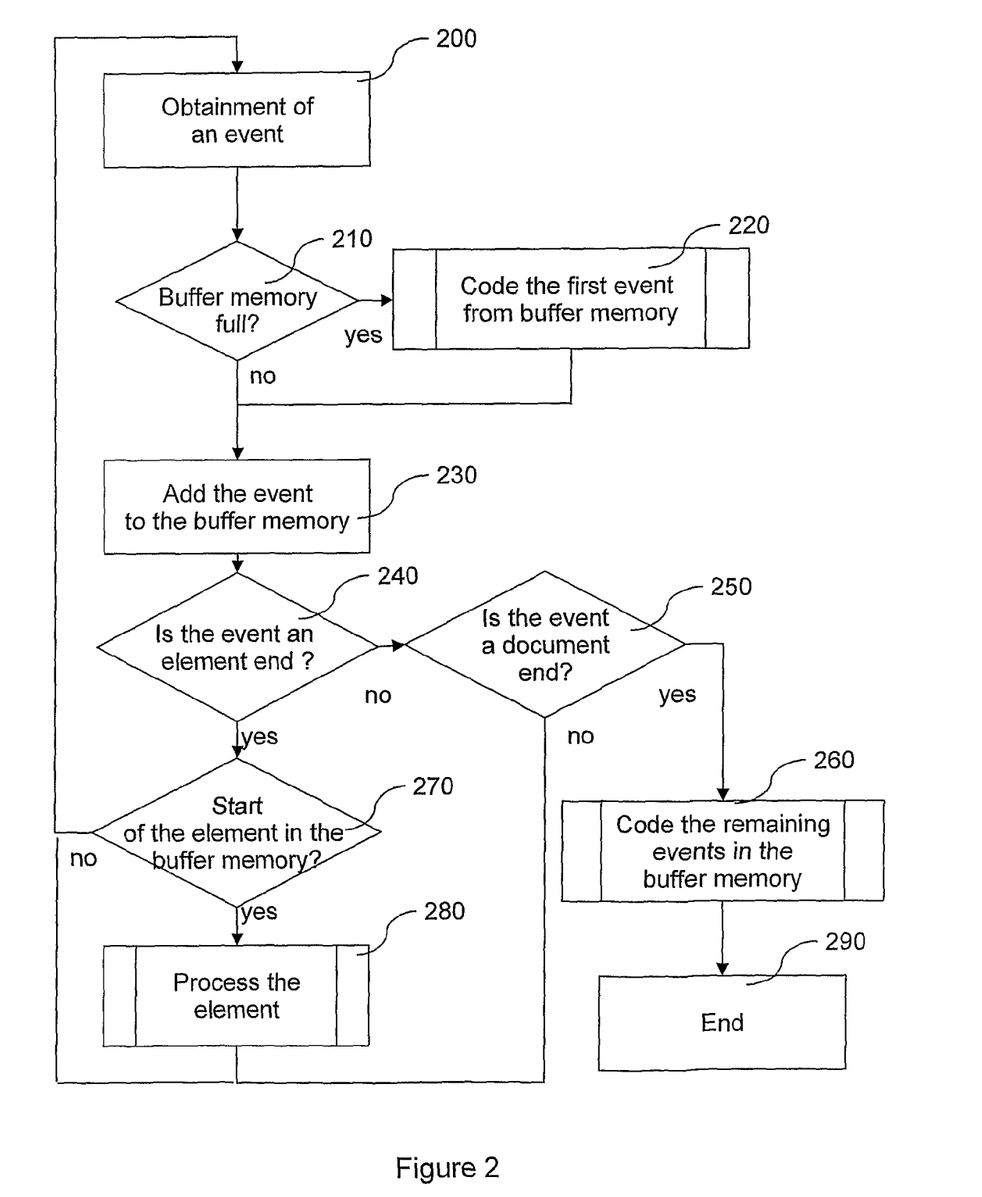
FIG. 2 represents, in the form of a logigram, a particular embodiment of the coding method of the present invention.

FIG. 2 presents the general processing carried out, in one embodiment of the present invention, in order to code an XML document, by creating structural patterns without waiting to entirely know the data. To that end, it is considered that XML events are received one by one, and, in order to preserve these pieces of information, they are stored in a buffer memory. Once sufficient data have been acquired, for example by comparison with a number of instances at a limit value, the creation of patterns is carried out. It is to be noted that the larger the memory space in the buffer memory, the more it is possible to accumulate data therein and delay the coding of those data, which increases the probability of using a pattern and thus of coding the data more efficiently.

During a step 200, an XML event us obtained. In the case of the XML document example presented above, the events that may be obtained are the following: document start, document end, element start, element end, text content and comment. During a step 210, it is determined whether the event buffer memory is full or not: if yes, during a step 220, the coding is carried out of the first event contained in the event buffer memory, that is to say the oldest event which was input into the event buffer memory and the memory space occupied by that event in the event buffer memory is freed, in order to store a new event therein, as set out in relation to FIG. 5.

If the result of step 210 is negative or after step 220, the event obtained during step 200 is added to the event buffer memory, during a step 230, and then it is tested (step 240) whether it is an element end, during a step 240.

If the event is an element end, it is determined whether the start of the element is still present in the buffer memory, during a step 270. If yes, this means that the whole content of the element is in memory, and, for that element, a pattern is created and/or processing is carried out of the number of instances linked to a pattern already created, during a step 280 detailed in relation to FIG. 3, before returning to step 200 in order to obtain the next event. If the result of step 270 is negative, step 200 is returned to. It is to be noted that the tests carried out during the steps 240 and 270 make it possible to determine whether the pattern creation algorithm must be invoked. The pattern creation algorithm, described in relation to FIG. 3, searches for patterns covering the entirety of an element, using a twin criterion:

the reception of the end of an element, which is the subject of the test of step 240, and the verification of the presence of the corresponding start element event in the buffer memory, which verification is the subject of the test of step 270.

It is to be noted that other pattern creation criteria may, in accordance with the present invention, be chosen, to enable for example the creation of patterns only representing a part of an element. Thus, in the case of a buffer memory of small capacity, priority may be given to creation of patterns representing a small number of events, without necessarily waiting for the end of an element (creation over the start of the element and a portion of its children, or else creation over a portion of the children of the element). On the contrary, in the case of a buffer memory of sufficient capacity, priority may be given to the creation of patterns representing an element and all its children.

It should be commented that, where a pattern is associated with the current element during processing step 280, that element and its children associated with the same pattern are grouped together into a single "Pattern" composite event which replaces the separate events in the buffer memory (those separate events describing an instance of that pattern). This "Pattern" composite event combines, on the one hand, a reference to a pattern (which makes it possible to know the structure of the data) and, on the other hand, the information which appears in the instance but not in that pattern (for example text content information). Thus, all the information is kept in the form of a single event, instead of being in separate events. Space is thus liberated in the buffer memory, and, consequently, it is possible to acquire more data at the same time, which makes it possible to obtain better results in terms of compression.

If, during step 240, it is determined that the event is not an element end, it is determined during a step 250 whether that event represents the end of the document. If not, step 200 is returned to. If yes, it is known that no further event remains to be acquired, and the coding of the events remaining in the buffer memory is proceeded with, during a step 260, as described in relation to FIG. 5, and the processing ends, during a step 290.

Figure 3:
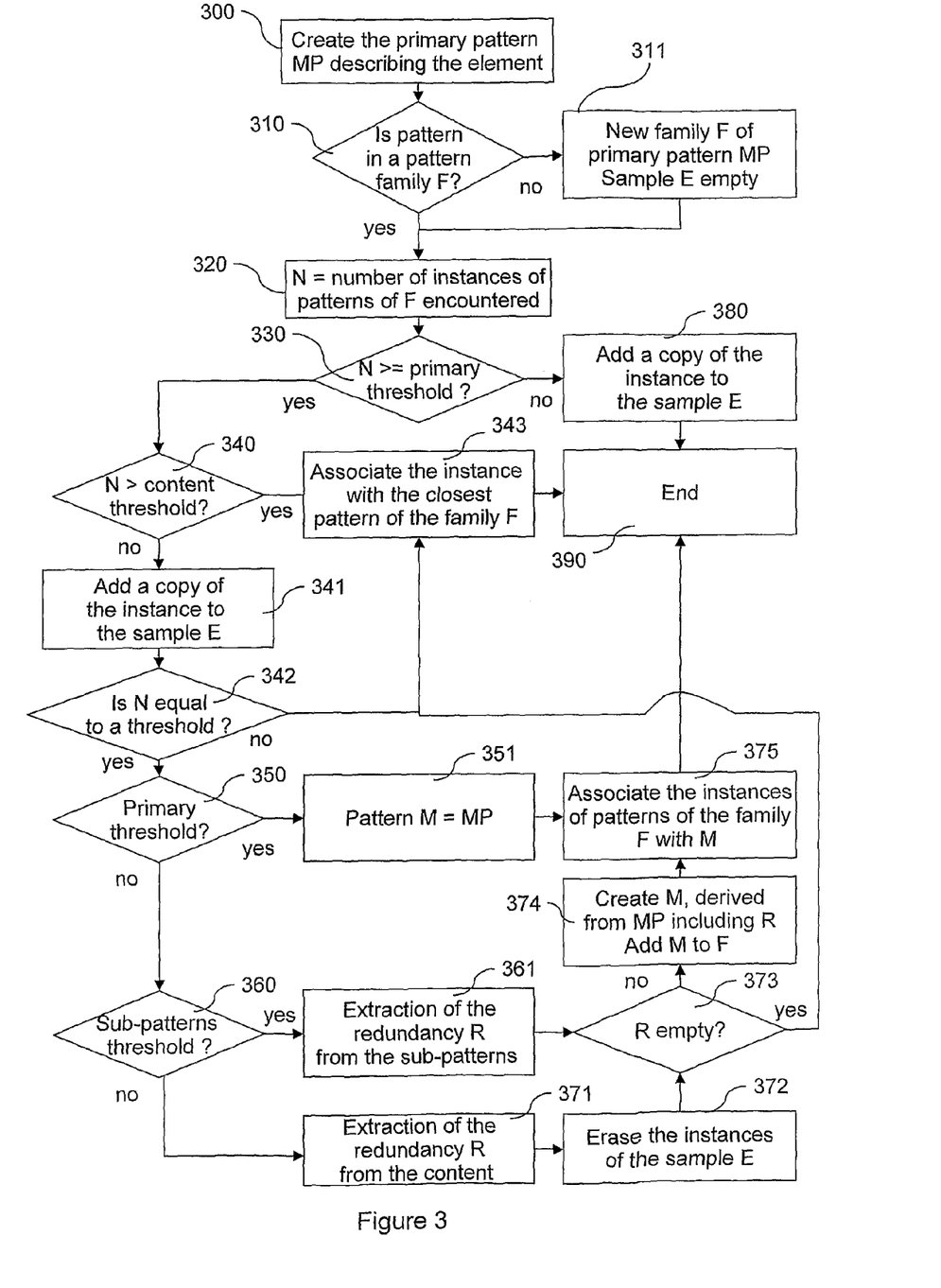
FIG. 3 is a representation in the form of a logigram of the steps implemented for a first method of creating patterns of one of the steps illustrated in FIG. 2.

FIG. 3 describes the creation of patterns and the association between patterns and instances. In a first phase, a primary pattern is created on the basis of an XML element. This primary pattern describes the structure of the element and of its children, and is thus suitable for any other element having the same structure. This pattern defines a family F of patterns of which it is the first element. The processing applied consists of enriching that primary pattern to form a derived pattern by additions of information when sufficient instances are available, which is determined, for example, by comparison of the number of instances with a predetermined threshold value, the instances being copied into a list E associated with the family of patterns F, which plays the role of sample and is called "sample". In the embodiment described in FIG. 3, different thresholds are defined. With certain thresholds there correspond patterns that are termed "derived" due to the fact that they are derived from the primary pattern of a family F of patterns. These different patterns are added to the primary pattern in the family F of patterns. When all the thresholds have been attained, no further derived pattern remains to be created, and the instances kept in the sample E can thus be erased. In such a case, when a new element is encountered, the pattern of the family F of patterns is searched for which describes it best, that is to say which minimizes the quantity of information representing the difference between that element and that pattern. In the best of cases, it is the last derived pattern defined (this is the one which contains the most information); in the worst case, the primary pattern is suitable.

In the embodiment illustrated in FIG. 3, the use of three thresholds is considered, which, in the order of increasing values, are:

what is designated a "primary" threshold,
what is designated a "sub-pattern" threshold and
what is designated a "content" threshold By way of non-limiting example, the inventors have determined that the respective values "3", "4" and "5" gave good results for the documents which they coded by implementing the present invention.

These thresholds correspond to different types of information present in the patterns, this being in increasing degree of probability of redundancy. More particularly, the primary threshold corresponds to the structure of the primary pattern, which never changes for a given primary pattern. Where several close structures are grouped into the same family, the structure of the primary pattern nevertheless remains fixed once sufficient instances have been grouped together in the family to be able to determine the primary pattern. What is designated as "sub-pattern" threshold concerns the pieces of information relating to the content patterns; these pieces of information relate to the structure of the document, and are often redundant. Thus, in the case of the XML document cited earlier, the same sub-patterns "firstName" and "lastName" are to be found for an instance of the "person" pattern. Lastly, what is designated as "content" threshold concerns the pieces of content information, that is to say the text values (in contrast to the structure). It may happen that these pieces of information are redundant, but this does not represent a majority of cases. In the case of the XML document cited previously, the persons have the same last name, but not the same first name.

The values of these different thresholds are arbitrarily defined. With low values, there is greater risk of causing inaccuracies in the detection of redundancy, but the quantity of information to be kept is minimized; at the other extreme, with high values, the extraction of the redundancy will be more reliable but the quantity of information will be higher, and the processing costlier and longer.

The values of these different thresholds may be determined experimentally, by applying the invention to a set representing XML documents, to verify which are the values that give the best results. In the same way, it is also possible to determine several sets of values corresponding to different types of documents or to different processing configurations. In this case, depending on the type of XML document or on the processing configuration used, the coder chooses which set of values to use. In this last case, if the patterns are not transmitted with the coded document, all the values used are transmitted in the coded document in order for the decoder to be able to reconstruct the same patterns.

The first step illustrated in FIG. 3, step 300, consists of creating the primary pattern MP describing the element considered. During step 300, the element, its attributes and its children are processed, in order to extract therefrom its structural model. In particular, if a child is an element, it is considered as a sub-pattern.

In the case of the XML document presented above, for a "person" element, the primary pattern is the following:

```
<person>
    Pattern
    Pattern
</person>
```

For the "firstName" element, since the "lastName" element is similar, the primary pattern is the following:

```
<firstName>
    Contenu textuel
</firstName>
```

Once these primary patterns have been created, it is determined during a step 310 whether a pattern with the same structural model has already been defined in a family F of patterns. If not, during a step 311, a new family F of patterns is created of which MP is the primary pattern and an empty sample E is associated with the family F of patterns.

As a variant, in particular in the case of use of an XML schema, the steps 300 to 310 are replaced or completed by a step of obtaining primary patterns that are associated with the document, for example in its schema. In this case too, for each primary pattern so obtained, a new family F is created, and an empty sample E is associated therewith.

If the result of step 310 is positive, or further to step 311, determination is made during a step 320 of the number N of instances encountered for the family F, that is to say the number of elements matching the primary pattern MP.

Next, during a step 330, it is determined whether the number of instances N is greater than a primary threshold, starting from which threshold the patterns are used. It is to be noted that the primary threshold is determined by learning in order that at that threshold or beyond, it is worthwhile, in terms of compression rate, to use a pattern for the coding (for example if the quantity of information to code the definition of the patterns is greater than that of the direct coding of the instances).

If the result of step 330 is negative, during a step 380, a copy of the instance is added to the sample E associated with F, the processing terminates during a step 390, and step 200 illustrated in FIG. 2 is returned to. Thus, returning to the XML document example detailed above, if the primary threshold is set to the value "3", for the first two instances, addition of a copy to the sample E is carried out but no association with a pattern is made.

If the result of step 330 is positive, determination is made during a step 340 of whether the number N of instances is strictly greater than what is designated a "content" threshold, which is the highest threshold, also termed limit threshold. It is to be noted that the value of this limit threshold is not necessarily equal to the value of the content threshold. If yes, there is no pattern to be created and the closest pattern in the family F is searched for, during a step 343, and it is associated with the instance in course of being processed. The processing of this instance terminates during a step 390, and step 200 illustrated in FIG. 2 is returned to. In the case of the XML document described earlier, if the content threshold is set to 5, the sixth instance will be dealt with in the same way.

If the result of step 330 is negative, that is to say if the content threshold is not attained by the number N of instances, a copy of the instance is added, during a step 341 to the sample E associated with the family F of patterns under consideration.

Next, during a step 342, it is determined whether the number N of instances is equal to one of the thresholds. If not, during the step 343 the instance is associated with the closest pattern of the family F of patterns, the processing terminates during the step 390, and step 200 is returned to.

If the result of step 342 is positive, it is determined during a step 350 whether the number N of instances is equal to the primary threshold plus one. If yes, use is commenced during a step 351, of the patterns for the instances of the family F of patterns and the primary pattern MP is designated by M, since it is the only pattern of the family F of patterns. Next, during a step 375, the instances of the family F of patterns is associated with that primary pattern M, which means that if the instances were to be coded at that moment, they would be coded with that pattern, it being possible for the association to be modified later. It is to be noted that certain instances of the family F could have been coded before reaching the primary threshold, in particular where the buffer memory is full and where data had been coded which were located therein to free memory space (see step 220 in FIG. 2). In that case, the association made during step 375 is not carried out for those instances already coded, but they are kept in the sample E. It is to be noted that the number N takes into account all the instances, even those which have been coded without using the pattern. Thus, the number N represents the number of instances encountered for the family F, independently of the fact of whether or not a pattern from F has been used to code the instance under consideration.

Referring to the XML document example detailed earlier, with a primary threshold equal to "3", it is when the third instance is encountered that use of the patterns is started. Thus the primary pattern MP is associated with the first three instances, if none has yet been coded.

If the result of step 350 is negative, it is determined during a step 360 whether the number N of instances is equal to the threshold of the sub-patterns. If yes, during a step 361 the redundancy is extracted relative to the sub-patterns in the instances of the sample E. To extract this redundancy, the sub-patterns present in each instance is compared, and the constant sub-patterns are selected. As a variant, a less restrictive criterion than constancy is implemented, for example by comparing the degree of representativeness, that is to say a degree of presence of a sub-pattern in the instances, with a limit value, the extraction of redundancy being carried out beyond that limit value.

Returning to the XML document example illustrated above, with the sub-patterns threshold having the value "4", it is found on the basis of the first four instances stored in the sample, that the "firstName" and "lastName" sub-patterns are constant since they always take the form "<firstName>Text content</firstName>" and "<lastName>Text content</lastName>" respectively. The pattern "MS" described above is thus created and associated with the instances which have not yet been coded:

```
<person>
    <firstName>Text content</firstName>
    <lastName>Text content</lastName>
</person>
```

If the result of step 360 is negative, the redundancy relative to the text content is extracted in the instances of the sample E, during a step 371. To extract this redundancy, comparison is made of the values of the text content and of the attributes in each instance, and the constant values are selected. As a variant, a less restrictive criterion than constancy is implemented, for example relating to the degree of representativeness defined above.

As the content threshold is higher, all the redundancies have been extracted, and the instances present in the sample E are erased during a step 372, which makes it possible not to occupy superfluous memory space for the given pattern.

Returning to the XML document example detailed above, with the content threshold having the value "5", the content redundancy is extracted by working over the first five instances. As the content values of the "firstName" elements change, none of them is selected. On the other hand, for the "lastName" element, the content value is always "Smith", and this content is added to the pattern "MS" to obtain the pattern "MC", which is associated with the instances which have not yet been coded.

```
<person>
    <firstName>Text content</firstName>
    <lastName>Smith</lastName>
</person>
```

For the sixth instance, the closest pattern in the family F={MP, MS, MC} is searched for, which in this case is MC.

After steps 361 and 372, determination is made during a step 373 of whether the extracted redundancy is empty. If yes, no derived pattern is created, and the instance is associated with the closest pattern during a step 343, and then the processing terminates during the step 390. Otherwise, a derived pattern is created by addition of the redundancy information to the richest pattern already defined and that derived pattern is added to the family F of patterns, during a step 374. Typically, the information from sub-patterns is added to the primary pattern to create the derived pattern MS, and the content information is added to the derived pattern MS to create the derived pattern MC or a derived pattern MC is directly created on the basis of a primary pattern MP, for example where there are no sub-patterns.

Next, during a step 375, the instances are associated with the new derived pattern. If the criterion chosen to determine the redundancy is constancy, the new pattern necessarily describes all the instances, and the association thus poses no problem. On the other hand, if a degree of representativeness is used as a basis, only the instances corresponding to the pattern are associated. The processing then ends during step 390.

The coding method presented above is not restrictive, and other types of thresholds and redundancies may be defined.

In variants, a threshold is defined for which the pieces of information are extracted that are relative to the strings that are only constituted by "blanks", such as spaces, tabulations and line feeds. This is because these strings serve for page layout for the document (line feed, indentation), and they therefore have a high probability of being constant.

In variants, secondary thresholds are defined for the sub-patterns or for the content and the instances described by the primary pattern MP are kept but not by the derived patterns MS or MC. When the number of these instances attains a secondary threshold, the pieces of redundancy information are extracted from those instances and, if appropriate, a new derived pattern is created which is added to the family F of patterns. The secondary thresholds are arbitrarily set so as to detect derived patterns having greater or lesser frequency: with a low threshold, pieces of information with a low degree of presence are identified, whereas with a high threshold, limitation is made to the pieces of information having numerous occurrences. The secondary thresholds prima fade have no link with the thresholds already defined, in particular it is not because the content threshold has been attained that the processing specific to a pattern family is stopped. This method may be reiterated so long as instances are found that are not described by the derived patterns created. However, in the case of a document with low redundancy, there is a risk of keeping a high number of instances and thus of taking up a large amount of space in memory. In order to limit this problem, in variants, a maximum threshold is defined for the number of instances: when that threshold is attained (that is to say when the total number of instances of patterns of a family F reaches that threshold), a final search for redundancy is carried out (and, if appropriate, a derived pattern is created) and then the sample E is cleared.

In still other variants, the primary patterns are not extracted from the XML document, but are obtained from sources exterior to the XML document, for example from an XML Schema document describing the structure of the XML document. In such a case, for each predefined primary pattern, a family F is created. Furthermore, if a predefined primary pattern exists, this means that it will probably be worthwhile to use it. Thus, the primary threshold for the predefined primary patterns may be reduced, or even fixed at the value zero, enabling the predefined primary patterns to be used as from the first instance.

In a sub-variant, a supplementary threshold is used, corresponding to the common parts of a primary pattern. This is because in the case of primary patterns obtained from an external source, those primary patterns may describe a wider set of possibilities than those used in a given XML document. For example, an XML Schema document will describe all the possibilities for the structure of an XML document. When the threshold corresponding to the common parts of a primary pattern has been reached, a derived pattern is created, corresponding to a restriction of the primary pattern: only the pieces of structural information contained in the primary pattern and present in at least one instance of the primary pattern are kept in this derived pattern. The use of the derived pattern for coding an instance makes it possible to reduce the number of absences to code and thus to reduce the cost of coding the instance.

In still other variants, other thresholds may be used. For example, a threshold corresponding solely to the content represented by the values of the attributes, or a threshold solely corresponding to the content represented by the items of text content type.

In another embodiment, the creation of the patterns is simplified. For each element considered, the primary pattern is created. The elements having the same primary pattern are grouped together into the same family. If the number of elements in the same family exceeds a predetermined value, all the redundancies in the elements of that family are extracted and a derived pattern is created from the primary pattern by including that redundancy. Subsequently, all the elements of that family will be coded on the basis of that derived pattern.

In this embodiment, a single threshold is used and only the derived pattern is used to code data.

In a variant of this embodiment the primary pattern is used to code data.

In another variant of this embodiment, only the redundancies relative to the sub-patterns are used to create the derived pattern.

In still another variant of this embodiment, only the redundancies relative to the contents are used to create the derived pattern.

In still other variants, only certain particular redundancies are used to create the derived pattern. For example, only the redundancies relative to an attribute value are used.

Figure 4:
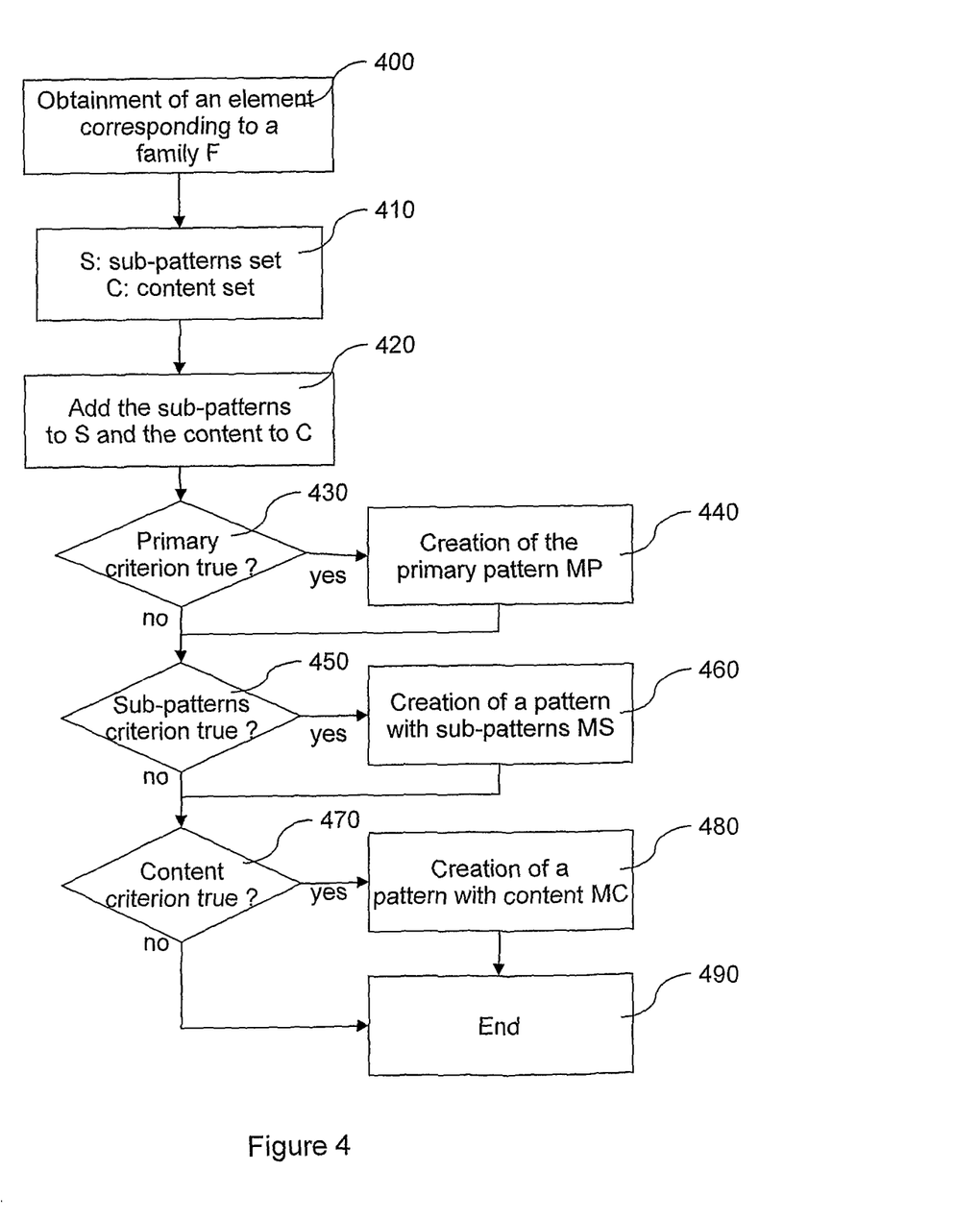
FIG. 4 is a representation in the form of a logigram of the steps implemented for a second method of creating patterns of one of the steps illustrated in FIG. 2.

FIG. 4 describes a variant for creating patterns. In this variant, instead of distinguishing instantiation thresholds linked to patterns as in the embodiment illustrated in FIG. 3, instantiation thresholds are defined linked to the parts of the patterns, with in particular an NS threshold for the number of instances of a sub-pattern, and an NC threshold for the number of instances of a content value. Thus, when a sub-pattern is present at least NS times, a derived pattern is created from the primary pattern including that sub-pattern, and when a content is present NC times, a derived pattern is created from the primary pattern including that content.

Compared with the description of the embodiment illustrated in FIG. 3, to describe FIG. 4, steps are described more summarily, but the mechanisms presented in relation to FIG. 3 also apply to FIG. 4. Thus, the sampling system operates in similar manner, and when pattern creation is referred to (steps 440, 460 and 480), the steps of extraction of redundancy, of analysis of that redundancy (whether or not nill), of pattern creation and of association with certain instances are grouped together. The main difference between the embodiments illustrated in FIGS. 3 and 4 concerns the management of the thresholds, since the threshold is no longer applied solely to the instances but also to the content of the instances. On account of this, steps 342 to 375 of FIG. 3 are replaced by steps 420 to 480 of FIG. 4.

During steps 400 and 410, an element is considered which corresponds to a family F of patterns, with S designating the set of the sub-patterns of the instances of the family F of patterns and C designating the set of contents of those same instances. Next, during a step 420, the sub-patterns of the element are added to the set S and the content of the element to the set C.

It is then evaluated whether primary pattern creation criteria are satisfied, during a step 430. To that end, determination is made of whether the number of instances of the family F of patterns is greater than or equal to the threshold value NP, determined by learning and/or on the basis of the features of the required resources and, if yes, a primary pattern is created and is associated with the instances which have not yet been coded, during a step 440.

Otherwise, or further to the step 440, it is determined whether criterion for creation of a pattern with sub-patterns is satisfied, during a step 450. To that end, for each sub-pattern SM of the set S, it is determined whether its number of instances is greater than or equal to the threshold value NS. If yes, during a step 460, a derived pattern MS is created containing that sub-pattern SM and deriving from the primary pattern. Furthermore, if other sub-patterns always appear with that sub-pattern SM, those other sub-patterns are included in the definition of the pattern MS.

If the result of step 450 is negative, or further to step 460, determination is made during a step 470, of whether criteria for creating a pattern with content are satisfied. To that end, for each content SC of the set C, it is determined whether its number of instances is greater than or equal to the threshold value NC. If yes, during a step 480, a derived pattern MC is created containing that content SC and derived either from the primary pattern MP, or from a pattern with sub-patterns MS with which the content is always associated, in the case of a constancy criterion, or, when a representativeness criterion is implemented, which is often associated. Furthermore, if other contents always appear with that content SC, those other contents are included in the definition of the derived pattern MC.

If the result of step 470 is negative or further to step 480, the processing ends, during a step 490 and step 200 is returned to.

An advantage of the variant illustrated in FIG. 4 resides in the fact that it is adapted to the creation of more patterns than the variant illustrated in FIG. 3.

Concerning the management of memory, in variants, to avoid keeping too much data, the decision is taken to delete the least representative information when a threshold is reached that is considered as a limit (defined arbitrarily according to the constraints that are adopted, in particular as concerns the memory required). If, for example, that limit threshold is reached for the sub-patterns in the set S (L different sub-patterns), the one for which no instance has been encountered for the longest period is erased. In variants, if the number of instances of elements represented by the family F of patterns itself reaches a limit threshold (similar to the maximum threshold for the number of instances described earlier), a last processing operation is carried out and then the data kept in the buffer memory are erased.

Figure 5:
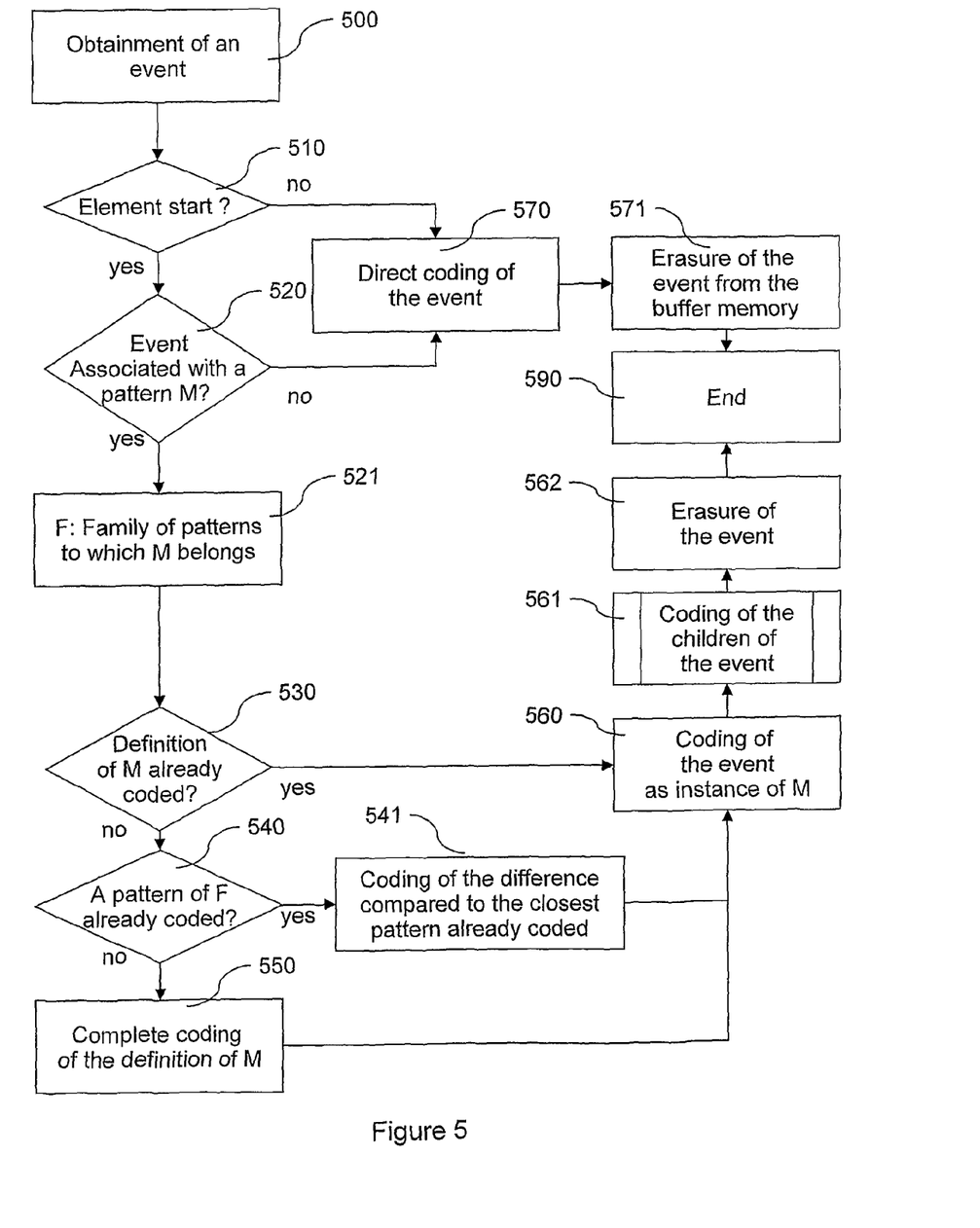
FIG. 5 represents, in logigram form, coding steps of steps illustrated in FIG. 2

FIG. 5 describes the coding of the data relative to an event, which is an XML event in the present case. Two cases occur: the coding of simple XML events and the coding of XML events linked to patterns.

During a step 500, an event to code is considered. During a step 510, it is determined whether the event E represents an element start. If not, during a step 570, the event is directly coded, either as an event forming part of a pattern, or as an independent event, according to techniques known per se, for example the techniques described in the introduction, with content indexes. It is to be noted that, in the case of an event forming part of a pattern, there is less information to code since the pattern describes some of the information of the event to code. Next, during a step 571, the event is erased from the buffer memory and the processing ends at step 590 and one of the steps 230 or 260 is returned to, according to the step, 220 or 260, respectively, whereby step 500 was arrived at. It is to be noted that, where the process came from step 260, it is returned to since several events must be coded and it includes a loop for that purpose.

If the result of step 510 is positive, that is to say if the event represents the start of an element, it is determined whether the event is associated with a pattern M, during a step 520. If not, the direct coding procedure already described is followed, during the steps 570, 571 and 590. If yes, the family F of patterns is obtained to which the pattern M belongs, during a step 521, and then it is determined whether the definition of the pattern M has already been coded, during a step 530. If the definition of the pattern M has not already been coded, it is coded, either in entirety, or by reference to another close definition. For this purpose, it is searched to see whether the definition of a pattern M' of the family F of patterns has already been coded, during a step 540. If yes, only the data which differ between the patterns M and M' are coded, during a step 541. It is to be noted that if several definition of patterns have already been coded, the closest pattern M' to the pattern M is chosen, the closeness being determined on the basis of the differences between the definitions. For those data which differ, as the different thresholds and the associated definitions are known, it is known which type of information is to be added or removed to pass from the definition of the pattern M' to the definition of the pattern M, which is advantageous to optimize the coding of the data and thus minimize the excess cost relative to the coding of several patterns of the same family F of patterns. If the result of step 540 is negative, the complete definition of the pattern M is coded, during a step 550.

Taking the document example detailed above once again, if the derived pattern MS has already been coded, to code the derived pattern MC, the pieces of content information are added, that is to say, for the "firstName" element, no value, and for the "lastName" element, the value "Smith". The existence or not of a value may be coded over 1 bit (and thus 2 bits here in total for the pattern MC), and the values of the contents of the elements of the pattern MS are then coded.

After the steps 541 and 550, as well as if the result of step 530 is positive, the event is coded as an instance of the pattern M, during a step 560, and then the coding of the children of the event are coded as data belonging to the instance of the pattern M, during a step 561. Next, the event is erased, during a step 562, and the processing ends at step 590.

A variant of the method presented in FIG. 5 consists of implicitly coding the patterns. In this case, the coding algorithm and the decoding algorithm share pattern creation rules, and it is not then necessary to code the definitions since they are determined automatically at both the coder side and the decoder side, which thus dispenses with steps 530 to 550. It is important to stress that, in this mode of operation, a pattern cannot be used to code the information which served to create it: this is because to know that a pattern must be created, the decoder must itself also read that information, since the coding-decoding process must be symmetrical. Compared with the method described in relation to FIG. 3, this means that a new pattern cannot be associated with instances encountered previously (step 375): the pattern will only be used for possible events to come.

Another variant consists of modifying step 550 to code the pattern M by differences with respect to another pattern already coded. For this, the pattern M is compared to the other patterns already coded. If the pattern M has a smaller number of differences relative to an already coded pattern than a predetermined threshold, the pattern M is coded by difference relative to that already coded pattern. For this, the reference of that already coded pattern is coded, as well as the differences of the pattern M relative to that already coded pattern.

Figure 6:
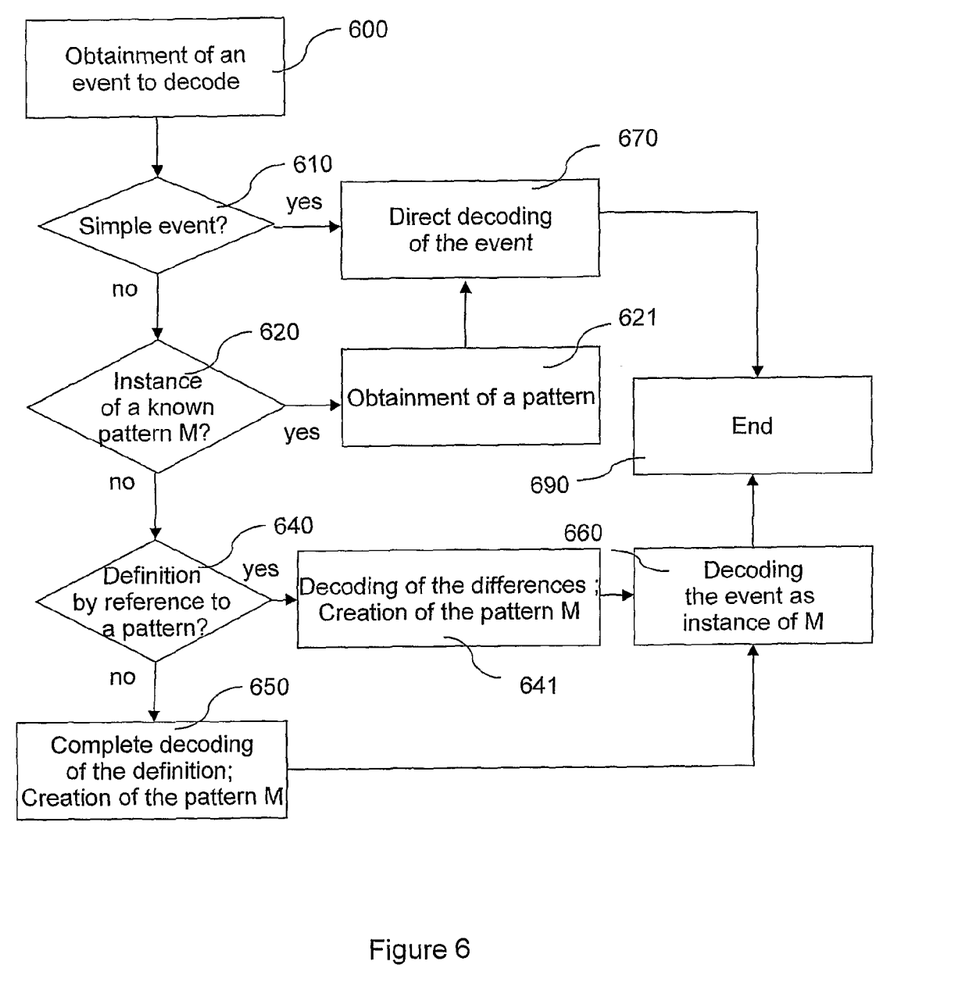
FIG. 6 represents, in logigram form, steps of a particular embodiment of the decoding method of the present invention.

FIG. 6 describes the decoding of an event, which is an XML event in the present case. Three cases occur: the decoding of simple events, the decoding of events linked to a known pattern and the decoding of an event linked to a new pattern. To decode a document in its entirety, the processing described in this Figure is applied until the event marking the end of the document is reached.

During a step 600, an event to decode is considered. During a step 610, it is determined whether the event is a simple event. If yes, during a step 670, the event is directly decoded, either as an event forming part of a pattern, or as an independent event. It is to be noted that, in the case of an event forming part of a pattern, there is less information to decode since the pattern describes some of the information of the event to decode. The processing of the document then ends at step 690 if the processed event is an end document event. Otherwise, step 600 is returned to in order to obtain the next event of the document.

If the result of step 610 is negative, that is to say if the event is not a standard event, it is determined whether the event corresponds to an instance of a known pattern M, during a step 620. If yes, the pattern concerned is obtained during a step 621, and then the direct decoding procedure described earlier is followed, during the steps 670 and 690. If not, this means that the event marks the start of an instance of a new pattern. The definition of the pattern M may appear either in its entirety, or by reference to another close pattern. The alternative chosen is obtained by reading data coded and evaluated at step 640. If the result is positive, only the differences before creating the pattern M are decoded, during a step 641. Otherwise, the complete definition of the pattern M is decoded, during a step 650; once these pieces of information have been read, the pattern M may be created.

Again taking the document example detailed above, if the derived pattern MS has already been decoded and the pattern MC has already been coded by reference to the pattern MS, to decode MC it will suffice to read the pieces of content information, in this case "Smith" for the sub-pattern "lastName".

After the steps 641 and 650, the event is decoded as an instance of the pattern M, during a step 660. The processing of the document then ends at step 690 if the processed event is an end document event. Otherwise, step 600 is returned to in order to obtain the next event of the document.

Where the variant for implicit coding of the patterns is adopted, it is not then necessary on decoding to read the definitions, as these are indeed obtained automatically from the rules of pattern creation that are shared between the coder and the decoder. Steps 640 to 660 then disappear. In this case, the decoder reproduces the steps carried out by the coder, on the basis of the data of the document already decoded, possible primary patterns obtained, for example, from a schema, from patterns of which the definition has already been decoded. In particular, the decoder carries out a step of obtaining at least one pattern designated as "primary" representing at least one of the pieces of structural information of data from said document, a step of creating at least one derived pattern formed by modifying a primary pattern, representing data of a part of the document that is different from the set of data of the document.

To reproduce the operation of the coder, the decoder may count the instances of a pattern and, on the basis of the threshold values described in relation to FIG. 3, perform a step of triggering the creation of at least one derived pattern.

Similarly, to reproduce the operation of the coder and create a derived pattern, the decoder may carry out redundancy extraction (representing sub-patterns or contents, constant or present at a sufficient degree of presence in the instances processed) from different instances of a pattern.

The invention claimed is:

1. A method of encoding one structured document comprising a plurality of events, the method comprising:
   obtaining and storing events of the structured document in a buffer memory; and while storing the events in the buffer memory:
   obtaining at least one primary piece of structural information representing a structure of a group of events from the events of said one structured document stored so far in the buffer memory; and
   creating at least one derived piece of structural information, formed by addition of redundancy information to the primary piece of structural information, representing a group of events of said one structured document stored so far in the buffer memory; and
   encoding events of said one structured document stored in the buffer memory using the obtained at least one primary piece of structural information or the created at least one derived piece of structural information;

wherein the encoding step is executed when, following the storing of the events, the occupancy of the buffer memory reaches a predetermined threshold.

2. The method of encoding one structured document according to claim 1, wherein each group of events comprises a start event and an end event, thus defining an element of said structured document, and wherein said redundancy information comprising a name of a child element or a text value.

3. A method according to claim 1, further comprising a further encoding step of encoding a definition of a piece of structural information associated with encoded data.

4. A method according to claim 3, wherein in said further encoding step, the definition of the piece of structural information is encoded by encoding a difference between the data represented by that piece of structural information and the data represented by another piece of structural information already encoded.

5. A method according to claim 1, further comprising a triggering step of triggering the creating step, during which comparison is made with at least one predetermined threshold value, for data of part of the document, of a number of instances of pieces of structural information of a piece of structural information family comprising at least one primary piece of structural information and, in case of equality, the step of creating at least one derived piece of structural information is triggered.

6. A method according to claim 5, wherein in the triggering step, said number of instances is compared to a limit threshold value and if the number of instances is greater than said limit threshold value, the step of creating derived piece of structural information is not triggered.

7. A method according to claim 1, wherein in said creating step an extracting step is carried out of extracting redundancy of different instances of a piece of structural information and the derived piece of structural information represents the redundancy.

8. A method according to claim 7, wherein in the extracting step, the redundancy comprises each constant sub-piece of structural information of the instances.

9. A method according to claim 7, wherein in the extracting step, the redundancy comprises each constant content of the instances.

10. A method according to claim 7, wherein in the extracting step, the redundancy comprises each sub-piece of structural information having a degree of presence in the instances greater than a predetermined limit value.

11. A method according to claim 7, wherein in the extracting step, the redundancy comprises each content having a degree of presence in the instances greater than a predetermined limit value.

12. A method according to claim 1, wherein in the encoding step, the code supplied represents the difference between the data represented by a piece of structural information and the piece of structural information with which the data are associated.

13. A method according to claim 1, wherein the structured document is described in XML language.

14. A method according to claim 13, further comprising a composite event creating step of creating a composite event which collects together an element of the document and at least one of its child nodes associated with the same piece of structural information as said element.

15. A method of decoding one structured document comprising a plurality of events, the method comprising:

obtaining and storing events of the structured document in a buffer memory; and while storing the events in the buffer memory:

obtaining at least one primary piece of structural information representing a structure of a group of events from the events of said one structured document stored so far in the buffer memory; and creating at least one derived piece of structural information formed by addition of redundancy information to the primary piece of structural information, representing a group of events of said one structured document stored so far in the buffer memory; and decoding events of said one structured document stored in the buffer memory using the obtained at least one primary piece of structural information or the created at least one derived piece of structural information;

wherein the decoding step is executed when, following the storing of the events, the occupancy of the buffer memory reaches a predetermined threshold.

16. A device for encoding one structured document including a plurality of events, the device comprising:

a buffer memory for storing events of the structured document; and a processor configured to carry out the steps of:

obtaining at least one primary piece of structural information representing a structure of a group of events from the events of said one structured document stored in said buffer memory;

creating at least one derived piece of structural information formed by addition of redundancy information to the primary piece of structural information; and encoding events of said one structured document stored in said buffer memory.

17. A device for decoding one structured document including a plurality of events, the device comprising:

a buffer memory for storing events of the structured document; and a processor configured to carry out the steps of:

obtaining at least one primary piece of structural information representing a structure of a group of events from the events of said one structured document stored in said buffer memory, creating at least one derived piece of structural information formed by addition of redundancy information to the primary piece of structural information; and decoding events of said one structured documents stored in said buffer memory.

18. A non-transitory computer readable storage medium which stores a program that can be loaded into a computer system, the program containing instructions enabling the implementation of the encoding method according to claim 1, when that program is loaded and executed by a computer system.

19. A non-transitory computer readable storage medium which stores a program that can be loaded into a computer system, the program containing instructions enabling the implementation of the decoding method according to claim 15, when that program is loaded and executed by a computer system.

20. A method according to claim 15, wherein each group of events comprises a start event and an end event, thus defining an element of said structured document, and wherein said redundancy information comprises a name of a child element or a text value.

* * * * *